United States Patent [19]
Sekine

[11] Patent Number: 5,472,812
[45] Date of Patent: Dec. 5, 1995

[54] METHOD FOR FORMING A PHOTOMASK PATTERN

[75] Inventor: Yasuhiro Sekine, Yokohama, Japan

[73] Assignee: Canon Kabushiki Kaisha, Tokyo, Japan

[21] Appl. No.: 266,318

[22] Filed: Jun. 27, 1994

Related U.S. Application Data

[63] Continuation of Ser. No. 911,057, Jul. 9, 1992, abandoned.

[30] Foreign Application Priority Data

Jul. 11, 1991 [JP] Japan .................................. 3-171201

[51] Int. Cl.⁶ ....................................................... G03F 9/00
[52] U.S. Cl. ............................. 430/5; 430/309; 430/320; 430/325; 430/329
[58] Field of Search ............................. 430/5, 309, 320, 430/325, 329

[56] References Cited

U.S. PATENT DOCUMENTS 4,377,627  3/1983  Vinton ........................................ 430/5

FOREIGN PATENT DOCUMENTS 0198446  10/1986  European Pat. Off. .
3707130  9/1988  Germany .
2172743  9/1986  United Kingdom .

OTHER PUBLICATIONS

R. A. Dellaguardia, et al., "X-ray Transmission Through Low Atomic Number Particles", IBM Research Division, 8226 Microelectronic Engineering, vol. 9, No. 1–4, pp. 139–142 (May 9, 1989).

Marc D. Levenson, et al., "Improving Resolution in Photolithography with a Phase–Shifting Mask", IEEE Transactions on Electron Devices, vol. ED–29, No. 12, pp. 1828–1836 (Dec. 1982).

S. M. Sze, VLSI Technology, pp. 465–467 (1983).

*Primary Examiner*—Mark A. Chapman
*Attorney, Agent, or Firm*—Fitzpatrick, Cella, Harper & Scinto

[57] ABSTRACT

A silicon film is formed on the surface of a substrate for a photomask, and a silicon nitride film is formed thereon. Then the silicon film and the silicon nitride film are patterned into desired shapes by photolithography method, the edge portion of the patterned silicon film is oxidized to provide a translucent region consisting of a silicon oxide film only on the edge portion, and the silicon nitride film is removed.

4 Claims, 1 Drawing Sheet

METHOD FOR FORMING A PHOTOMASK PATTERN

This application is a continuation of application Ser. No. 07/911,057, filed Jul. 9, 1992, now abandoned.

BACKGROUND OF THE INVENTION

1. Field of the Invention

The present invention relates to a method for forming a photomask pattern in which an integrated circuit pattern is formed on a semiconductor substrate, and more particularly to a method for forming a phase shift mask pattern at high precision.

2. Related Background Art

In the fabricating of a semiconductor device represented by a semiconductor integrated circuit (thereinafter abbreviated as LSI), a photomechanical process referred to as a so-called photolithography technique is used to form an integrated circuit pattern on a semiconductor wafer efficiently.

This photolithography technique uses a preformed photomask to form a pattern for the diffusion area of impurities, wiring pattern or contact hole on a wafer, whereby a corresponding pattern of the photomask is optically transferred onto the wafer.

Conventionally, a light shielding film pattern made of chromium formed on a transparent substrate made of quartz was used as the photomask. However, with the higher integration of LSI and the finer formation of pattern on the wafer, an attempt to improve the resolution of a transfer pattern has been made by varying the configuration of the photomask.

One such attempt involves a phase shift mask. The phase shift mask is one in which in addition to a conventional pattern consisting of a light shielding film region and a light transmitting region, a pattern consisting of a so-called phase shifter is formed on the mask surface. The phase shifter has a function of changing the phase of transmitted light, whereby a phase shift mask having a higher resolution limit than conventional masks can be obtained, even with the same projection lens, by forming a mask with an appropriate design of the phase of this phase shifter and the positional relation between the light shielding film pattern and the light transmitting pattern.

Currently, there have been proposed the following three types of structures for the phase shift mask (see Nikkei Microdevices, July, 1990, pp. 108–114, and April, 1991, pp. 75–77).

(1) Spatial frequency modulation type
(2) Edge intensified type
(3) Light shielding effect exaggeration type Among them, the methods (1) and (3) have several well-known problems in the practical use for semiconductor fabrication process, such that the arrangement of a phase shifter pattern may be difficult depending on the shape of the pattern to be formed, and only the negative type of photo resist can be used in the transfer of the pattern. On the contrary, the method (2) allows the arrangement of a phase shifter for a pattern of any shape, because of its mask configuration in which the phase shifter pattern is provided on only a boundary portion between the light transmitting pattern and the light shielding film pattern. Also, it has a number of advantages in the practical use in that the photo resist of either positive or negative type can be applied.

One of the formation methods for the phase shifter mask is such that after the light shielding film pattern is formed on the surface of a mask substrate, a transparent film is formed all over the surface of the mask substrate, and left behind only on the edge portion of the light shielding film, with the lithography method, to thereby make a phase shifter.

Another method is provided in which after the photo resist is applied over the surface of a substrate having the light shielding film pattern formed thereon, a photo resist mask is formed in a self-alignment manner only on the light shielding film with the development through ultraviolet light exposure over the entire surface from the back face, and then the anisotropic etching is made on the surface of the substrate to remove the substrate surface down to an intended depth. Then, only the light shielding film pattern remaining between the photo resist mask and the substrate is etched isotropically, and side-etched intentionally to an intended width, and then the photo resist mask is removed. In this case, a step portion formed by etching the substrate is a phase shifter.

This latter method has more advantages than the former method, in that although the number of lithography processes is increased by one in creating the mask, the resist mask for the formation of phase shifter can be formed in a self-alignment manner, and no addition of the film formation process for phase shifter is needed.

In the former method in which a transparent film is formed on the entire surface of a mask substrate having the light shielding film pattern formed thereon, and is made a phase shifter with the lithography method, the film formation process and the lithography process are performed twice respectively in creating the mask, and it is difficult to secure a sufficient alignment precision between the light shielding film pattern and the phase shifter pattern over the mask surface, since an electron beam exposure apparatus for use with the mask formation has normally no function corresponding to the alignment feature which is provided in an optical exposure apparatus.

In the latter proposal, since the resist mask used in the anisotropic etching of mask substrate is directly used as an etching mask in the side etching of the light shielding film pattern, it is impossible to ignore the influence from the deterioration of the side wall protective film or resist formed in the anisotropic etching, and the variation in size, whereby there are problems associated with the 10 precision of side etching, the reproducibility and the occurrence of many defects.

As above-described, with the heretofore proposed methods, it was difficult to improve the precision of forming the phase shifter pattern, and therefore it was extremely difficult to realize the resolution of the phase shift mask as designed.

SUMMARY OF THE INVENTION

An object of the present invention is to resolve the problems associated with the conventional arts concerning the method of forming the phase shift mask as above described, and to provide a method of forming both the light shielding film pattern and the phase shifter pattern at higher precision, with less defects and more stability.

A method for forming a photomask pattern according to the present invention includes forming a silicon film on the surface of a substrate for a photomask, and a silicon nitride film thereon, then patterning the silicon film and the silicon nitride film into desired shapes with the photolithography method, oxidizing the edge portion of the patterned silicon film to provide a translucent region consisting of a silicon oxide film only on the edge portion, and removing the silicon nitride film.

Ordinarily, the light shielding film for a photomask is a film made of chromium oxide, chromium nitride, or chromium nitric oxide which is laid down on the metallic chromium film. This is due to the fact that its rare film configuration can meet all of the light shielding property, adherence, acid resistance, stability and patterning characteristics, which are necessary for the light shielding film for a photomask, although the chromium and chromium compound film can not be used as the light shielding film in this invention as it can not be converted into a transparent solid with chemical change.

Therefore, the present inventor has found that the metallic silicon is most suitable, as a result of minute examination for the light shielding film material for use in the present invention. The metallic silicon film has a transmitting property for the light in the red to infrared region, but has a light shielding property for the light of 450 nm or less which is used in the photolithography process. Additionally, it has an excellent adherence to the silicon oxide for use as a photomask substrate, with its heat resistance affected little by the strong acid for use in the normal acid cleaning such as heat concentrated sulfric acid or nitric acid. It is also stable chemically, and has all the characteristics required for the light shielding film for a photomask, for example, because in the patterning characteristics, the anisotropic etching method with the dry etching is almost established. Further, it is known that the metallic silicon gradually changes into a homogeneous silicon oxide film from the surface in the oxidizing atmosphere of a high temperature. Accordingly, after a film for preventing the permeation of oxygen, for example, a silicon nitride film, is laid down on an upper layer of the metallic silicon film, the metallic silicon film or silicon nitride film are patterned at the same time, and then oxidized with only the side face of the metallic silicon exposed, whereby the silicon oxide film is grown from the most-upper layer on the side face of metallic silicon toward the inside of the pattern, with the metallic silicon film being surrounded like a stripe on its peripheral portion of pattern by the silicon oxide film. The pattern arrangement thus obtained is exactly the same as that of the phase shift mask in the edge intensified type in which the metallic silicon film is made a light shielding film and the silicon oxide film is made a phase shifter.

Since, with the method according to the present invention, the phase shifter can be arranged selectively only on the edge portion of a light shielding film pattern, with a substantially uniform width, and in a self-alignment manner, it can be concluded that this is an ideal method for forming the phase shifter pattern.

DETAILED DESCRIPTION OF THE PREFERRED EMBODIMENT

Figure 1A:
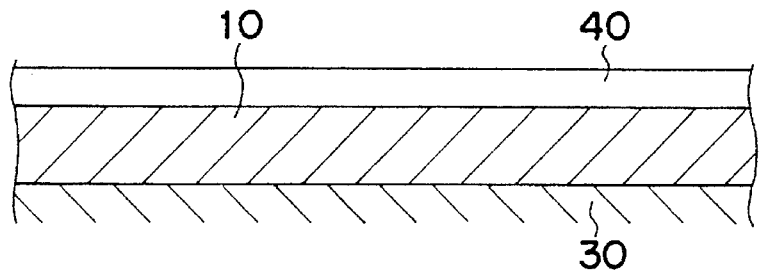
FIGS. 1A to 1E are schematic views illustrating a fabrication method of a mask according to the present invention.

The preferred embodiment of the present invention will be described below with reference to the drawings.

FIGS. 1A to 1E are schematic cross-sectional views of an embodiment of a micropattern forming method according to the present invention.

According to a preferred embodiment of the present invention, a substrate 30 for a photomask is first prepared. The substrate is only required to have a translucent area to form a mask pattern, and may be made of glass or quartz, for example.

Then, a silicon film 10 is formed, and a silicon nitride film 40 is formed thereon. The silicon film 10 may be made of monocrystal silicon, polycrystal silicon, microcrystal silicon, or amorphous silicon. The silicon nitride film 40 may be $Si_xN_{1-x}$ ($0<x<1$). These films are formed with the CVD, sputtering, or vapor deposition method.

Thereafter, the silicon film 10 and the silicon nitride film 40 are etched in accordance with a mask pattern, so that each pattern 12, 41 is left behind.

After the thermal oxidation, the edge portion of the silicon film pattern 12 not covered with the silicon nitride pattern 41 which is an oxidation resistant film becomes a silicon oxide film 21. Thereafter, unnecessary portions of the silicon oxide film 21 are removed in accordance with the silicon nitride pattern 41, so that the silicon oxide pattern 20 is formed. Finally, the phase shift mask is formed by removing the silicon nitride pattern 41.

Using this mask, a photo resist on a semiconductor wafer is exposed to g ray, i ray, excimer laser or X ray to form an integrated circuit, and a circuit pattern on the mask is transferred.

Thereafter, the photo resist is developed, and the film under the photo resist is etched, or impurities are diffused, with the remaining photo resist portion shaped like the circuit pattern being used as the mask. A desired circuit pattern is formed on the semiconductor wafer.

(Experimental Example 1)

As shown in FIG. 1A, a 0.5 μm thick polysilicon film 10 was formed on the surface of a substrate 30 made of synthetic quartz as the substrate for a photomask, with the CVD method. Subsequently, a 0.2 μm thick silicon nitride film 40 was laid down on the surface of the polysilicon film 10, with the CVD method.

Figure 1B:
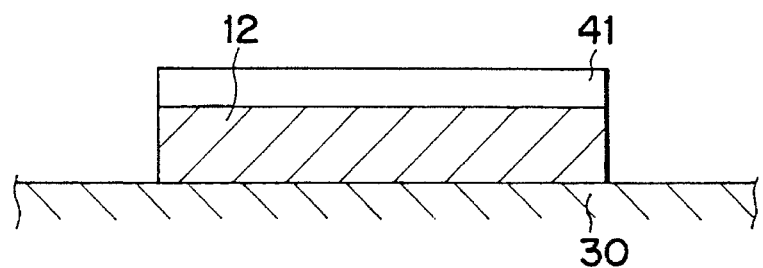

Then, with the photolithography method and the anisotropic etching, the polysilicon film 10 and the silicon nitride film 40 were patterned at the same time. With this patterning, the polysilicon film pattern 12 is sandwiched between the substrate 30 and the silicon nitride film pattern 41, as shown in FIG. 1B, with its cross-section exposed.

Figure 1C:
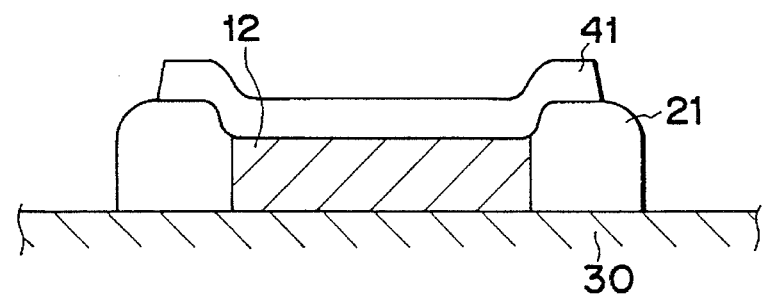

Then, the substrate 30 having the polysilicon film pattern 12 and the silicon nitride film pattern 41 formed thereon was oxidized for 30 hours in the atmosphere of water vapor at 800° C., and then a silicon oxide film pattern 21 having a width of 1.0 μm was formed around the periphery of the polysilicon film pattern 12, as shown in FIG. 1C.

Figure 1D:
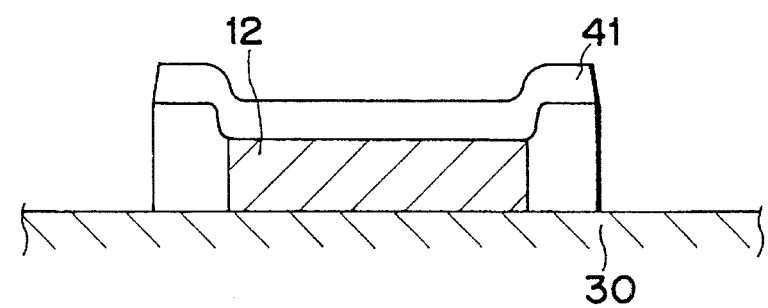

Further, the silicon oxide film bulging outside of the silicon nitride film pattern 41 was removed by anisotropic etching using a reactive ion etching, with the silicon nitride film pattern 41 as a mask. This is shown in FIG. 1D.

Figure 1E:
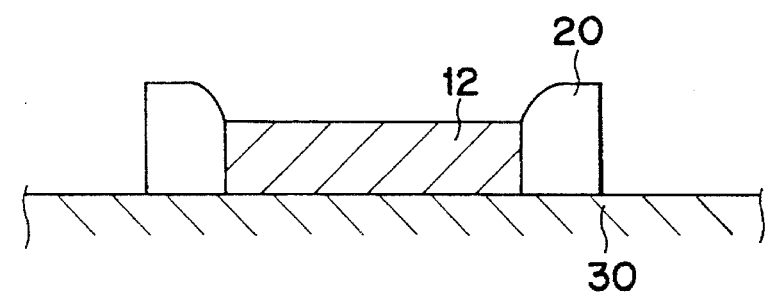

Finally, by removing the silicon nitride film pattern 41 in a boiling phosphoric acid (85%), a micropattern could be formed having a configuration in which a pattern 20 of a silicon oxide film, 1.0 μm thick and 0.7 μm wide, was arranged around the periphery of the polysilicon film pattern 12, as shown in FIG. 1E.

Another fabrication method is provided in which after forming a polysilicon film 10 on the surface of the substrate 30 firstly provided and before laying down the silicon nitride film 40 in the above-described procedure, an additional procedure of implanting phosphorus ions with $1\times10^{16}$ ions/cm$^2$ at 70 keV into the entire surface of polysilicon film 10 by ion implantation is provided, and further when a silicon oxide film pattern 21 is formed around the periphery of the polysilicon film pattern 12, after annealing in the atmosphere of nitrogen at 950° C. for 30 minutes, instead of oxidizing in the atmosphere of water vapor at 800° C. for 30 hours, the anodization may be made in an electrolyte of 85% phosphoric acid aqueous solution with the polysilicon film 10 pattern as an anode.

While in this example, the formation of a silicon film was performed with the CVD method, it can be understood that the formation of the silicon film may be performed by the sputtering or vacuum vapor deposition, with the substantially same effects.

Also, it will be appreciated that even if the silicon nitride film pattern 41 is removed in a state as shown in FIG. 1C where the silicon oxide film pattern 21 is formed, that is, in a state before the etching of the silicon oxide film pattern 21 with the silicon nitride film pattern 41 as a mask, it is possible to obtain a micropattern in which the translucent silicon oxide film pattern 21 is arranged around the periphery of the silicon film pattern 12.

In the micropattern forming method according to the present invention, after the silicon film and the silicon nitride film are laid down on the surface of substrate in this order, they are patterned with the photolithography method, and its edge cross-section is oxidized, whereby a translucent area consisting of the silicon oxide film is left behind only on the edge portion, and there is the effect that a high precision micropattern can be formed with lower defects and more stability.

What is claimed is:

1. A method for forming a phase shift photomask, comprising the steps of:

forming a light shielding layer with a silicon film on the surface of a substrate for the photomask and an anti-oxidizing layer with a silicon nitride film on the silicon film;

patterning the silicon film and the silicon nitride film into a desired shape, leaving an edge portion of the patterned silicon film exposed;

forming a translucent portion on the edge portion by oxidizing the edge portion of the patterned silicon film; and removing the patterned silicon nitride film.

2. A fabrication method for a semiconductor device, comprising the steps of:

forming a phase shift photomask by forming a light shielding layer with a silicon film on the surface of a substrate for the photomask and an anti-oxidizing layer with a silicon nitride film on the silicon film;

patterning the silicon film and the silicon nitride film into a desired shape, leaving an edge portion of the patterned silicon film exposed;

forming a translucent portion on the edge portion by oxidizing the edge portion of the patterned silicon film;

removing the patterned silicon nitride film; and forming a desired circuit pattern on the photomask.

3. The fabrication method according to claim 2, further including a process of exposing a photo resist on the semiconductor substrate using the mask.

4. A phase shift photomask, comprising:

a translucent support;

a light shielding pattern of a silicon film on said support; and a translucent phase shifter of silicon nitride formed by selective oxidation and provided at the edge portion of said light shielding pattern.

* * * * *

UNITED STATES PATENT AND TRADEMARK OFFICE
CERTIFICATE OF CORRECTION

PATENT NO. :  5,472,812
DATED      :  December 5, 1995
INVENTOR(S) : Sekine

It is certified that error appears in the above-indentified patent and that said Letters Patent is hereby corrected as shown below:

COLUMN 2:

Line 45, "10" should be deleted.
Line 60, "less" should read --fewer--.

COLUMN 5:

Line 32, "lower" should read --fewer--.

COLUMN 6:

Line 28, "mask." should read --photomask.--.

Signed and Sealed this

Twenty-fifth Day of June, 1996

Attest:

BRUCE LEHMAN

*Attesting Officer*     *Commissioner of Patents and Trademarks*